(12) United States Patent
Koui et al.

(10) Patent No.: US 7,038,893 B2
(45) Date of Patent: May 2, 2006

(54) MAGNETORESISTANCE EFFECT ELEMENT HAVING A NONMAGNETIC INTERMEDIATE LAYER HAVING A TWO-DIMENSIONAL FLUCTUATION OF RESISTANCE

(75) Inventors: Katsuhiko Koui, Kanagawa-ken (JP); Masatoshi Yoshikawa, Kanagawa-ken (JP); Masayuki Takagishi, Kanagawa-ken (JP); Masashi Sahashi, Kanagawa-ken (JP); Takeo Sakakubo, Kanagawa-ken (JP); Hitoshi Iwasaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/045,326

(22) Filed: Jan. 31, 2005

(65) Prior Publication Data

US 2005/0128650 A1 Jun. 16, 2005

Related U.S. Application Data

(62) Division of application No. 10/400,638, filed on Mar. 28, 2003.

(30) Foreign Application Priority Data

Mar. 28, 2002 (JP) .............................. 2002-093358

(51) Int. Cl.
  *G11B 5/39* (2006.01)
(52) U.S. Cl. ................ 360/324.2; 360/324.1
(58) Field of Classification Search ............ 360/324.1, 360/324.11, 324.12, 324.2, 317
See application file for complete search history.

(56) References Cited

U.S. PATENT DOCUMENTS

| | | | |
|---|---|---|---|
| 5,715,121 A | 2/1998 | Sakakima et al. | 360/324.2 |
| 5,949,622 A | 9/1999 | Kamiguchi et al. | 360/324.12 |
| 5,966,322 A | 10/1999 | Pohm et al. | 365/158 |
| 6,111,729 A | 8/2000 | Kamiguchi et al. | 360/324.1 |
| 6,348,274 B1 | 2/2002 | Kamiguchi et al. | 428/692 |
| 6,538,861 B1 | 3/2003 | Hayashi et al. | 360/324.2 |
| 6,560,077 B1 | 5/2003 | Fujiwara et al. | 360/324.1 |

(Continued)

FOREIGN PATENT DOCUMENTS

JP 9-172212 6/1997

(Continued)

*Primary Examiner*—Jefferson Evans

(74) *Attorney, Agent, or Firm*—Oblon, Spivak, McClelland, Maier & Neustadt, P.C.

(57) ABSTRACT

A magnetoresistance effect element comprises a magnetoresistance effect film including a magnetically pinned layer whose direction of magnetization is pinned substantially in one direction, a magnetically free layer whose direction of magnetization changes in response to an external magnetic field, and a nonmagnetic intermediate layer located between the pinned layer and the free layer; and a pair of electrodes electrically connected to said magnetoresistance effect film to supply a sense current perpendicularly to a film plane of said magnetoresistance effect film. The intermediate layer has a first layer including a first region whose resistance is relatively high and second regions whose resistance is relatively low. The sense current preferentially flows through the second regions when the current passes the first layer. Alternatively, the concentration of oxygen in the first layer may have a two-dimensional fluctuation, and a first region where the concentration of oxygen is equal to or higher than 40 atomic % and a second region where the concentration of oxygen is equal to or lower than 35 atomic % may be provided in the first layer.

17 Claims, 9 Drawing Sheets

U.S. PATENT DOCUMENTS

| | | | |
|---|---|---|---|
| 6,590,750 B1 | 7/2003 | Abraham et al. | 360/324.2 |
| 6,635,366 B1 * | 10/2003 | Saito et al. | 428/692 |
| 6,680,831 B1 * | 1/2004 | Hiramoto et al. | 360/324.11 |
| 6,759,084 B1 | 7/2004 | Ju et al. | 427/126.4 |
| 6,771,473 B1 * | 8/2004 | Hiramoto et al. | 360/324.2 |
| 6,784,509 B1 | 8/2004 | Yuasa et al. | 257/421 |
| 2002/0039091 A1 | 4/2002 | Saishu et al. | 345/97 |
| 2003/0011463 A1 | 1/2003 | Iwasaki et al. | 338/32 R |
| 2003/0011945 A1 | 1/2003 | Yuasa et al. | 360/324.1 |
| 2004/0201929 A1 | 10/2004 | Hashimoto et al. | 360/324.1 |

FOREIGN PATENT DOCUMENTS

| | | |
|---|---|---|
| JP | 2001-250208 | 9/2001 |
| JP | 2003-204094 | 7/2003 |

\* cited by examiner

MAGNETORESISTANCE EFFECT ELEMENT HAVING A NONMAGNETIC INTERMEDIATE LAYER HAVING A TWO-DIMENSIONAL FLUCTUATION OF RESISTANCE

CROSS-REFERENCE TO RELATED APPLICATIONS

This application is based upon and claims the benefit of priority from the prior Japanese Patent Application No. 2002-093358, filed on Mar. 28, 2002; the entire contents of which are incorporated herein by reference.

BACKGROUND OF THE INVENTION

This invention relates to a magnetoresistance effect element, a magnetic head, a magnetic reproducing apparatus, and a magnetic memory and more particularly, to a magnetoresistance effect element which has a structure where a sense current is passed perpendicularly to a film plane of the magnetoresistance effect film, and to a magnetic head using the same, a magnetic reproducing apparatus and a magnetic memory.

In a certain kind of ferromagnetic substance, a phenomenon in which resistance changes according to strength of an external magnetic field is known, and this is called the "magnetoresistance effect." This effect can be used for detection of an external magnetic field, and such a magnetic field detecting element is called "the magnetoresistance effect element (it is also hereafter called "MR element")."

Such a MR element is industrially used in a magnetic recording and reproducing apparatus, and used for read-out of information which is stored in a magnetic recording medium, such as a hard disk and magnetic tape, (for example, IEEE MAG-7,150 (1971)), and such a magnetic head is called a "MR head."

In recent years, in a magnetic recording and reproducing device with which these MR elements are used, especially in a hard disk drive unit, the magnetic storage density is increased. As a result, the recording bit size on the medium becomes smaller, and the quantity of leaking magnetic flux from the recording bit, i.e., a signal magnetic field, is being smaller.

Therefore, it is becoming indispensable to realize a MR element which has a higher S/N ratio and higher sensitivity by obtaining a resistance rate of change at a lower magnetic field. This development serves as important base technology for improvement in storage density.

Here, "high sensitivity" means that an amount of resistance change ($\Omega$) per unit magnetic field (Oe) is large. A MR element having a larger MR changing rate and being excellent in the soft magnetic characteristic becomes more sensitive. In order to realize a high S/N ratio, it is important to reduce a thermal noise as much as possible. For this reason, it is not desirable that resistance of the element itself becomes large. For example, when using as a reading sensor for a hard disk drive, a resistance of about 5 ohms–30 ohms is desired as the element resistance in order to realize a good S/N ratio.

From the background, it is becoming common to use the spin valve (spin-valve) film which can obtain big MR rate for a MR element used for a hard disk drive.

FIG. 12 is a conceptual diagram which illustrates the sectional structure of a spin valve film. That is, the spin valve film 100 has the structure where a ferromagnetic layer F, a non-magnetic layer S, a ferromagnetic layer P, and an antiferromagnetic layer A are laminated in this order. Two ferromagnetic layers F and P which sandwich the nonmagnetic layer S therebetween are magnetically uncoupled.

Magnetization of one ferromagnetic layer P is fixed in one direction by an exchange bias which is applied from the antiferromagnetic layer A. A magnetization of the ferromagnetic layer F is made rotatable easily by external magnetic fields (signal magnetic field etc.). By an external magnetic field, only magnetization of the ferromagnetic layer F can be rotated, and thus, the relative angle of the magnetization direction of two ferromagnetic layers P and F can be changed. As a result, a large magnetic resistance effect can be acquired (Phys. Rev. B, Vol. 45, 806 (1992), J. Appl. Phys. Vol. 69, and 4774 (1991)).

Here, the ferromagnetic layer F is called a "free layer", a "magnetic field reception layer", or a "magnetization free layer" in many cases. The ferromagnetic layer P is called a "pinned layer" or a "magnetization fixed layer." The nonmagnetic layer S is called a "spacer layer", an "interface adjusting intermediate layer", or a "intermediate layer."

In the case of a spin valve film, magnetization of the free layer F, i.e., a ferromagnetic layer, rotates easily even in a lower field. Therefore, a raise in sensitivity is possible and it is suitable for MR element for MR heads.

To such a spin valve element, in order to detect change of resistance by a magnetic field, it is necessary to pass a "sense current."

Conventionally, a sense current is generally passed in parallel to the film plane, and resistance of a parallel to the film plane is measured. This method is generally called the "CIP (current-in-plane)" system.

In the case of a CIP system, it is possible to acquire about 10–20% of value as a MR rate of change. In the magnetoresistance effect head of the shield type currently used, since a spin valve element is used in the plane form almost near a square, resistance of MR element becomes almost equal to the plane resistance value of MR film.

Thus, in the case of the spin valve film of a CIP system, it becomes possible by setting a field resistance value to 5 ohms–30 ohms to acquire the good S/N property.

Resistance of this level can be realized comparatively easily by making thickness of the whole spin valve film thin. For this reason, at present, the spin valve film of a CIP system is generally used as a MR element for MR heads.

However, in order to realize information reproduction with high storage density which exceeds 100 Gbits/inch$^2$, it is expected that the value which exceeds 30% as a MR rate of change is needed. However, it is difficult to acquire the value which exceeds 20% as a MR rate of change by the conventional spin valve film. Therefore, it has been a big technical subject for further improvement in the storage density how this MR rate of change can be increased.

From such a viewpoint, the spin valve which inserted the "electronic reflective layer" into the pinned layer or the free layer in the CIP-SV film is proposed in order to increase MR rate of change. As the electronic reflective layer, an oxide, a nitride, a fluoride, or a boride can be used.

For example, an electronic reflective layer can be inserted into the pinned layer and the free layer, respectively. By a spin valve film, if electronic scattering takes place at the interface of each layer, a mean free path will decrease, and MR rate of change will decrease. On the other hand, by providing the electronic reflective layer ER to reflect electrons, the mean free path of electrons is made to increase, and it becomes possible to obtain large MR rate of change.

Moreover, in the case of this structure, the probability that an electron will pass through the interface of a magnetic layer/nonmagnetic layer also goes up by reflecting electrons.

For this reason, it becomes possible to acquire the same effect as the case in an artificial lattice film, and MR rate of change increases.

However, also in this structure, since all electrons may not pass through the interface of a magnetic layer/nonmagnetic layer, there is a limit in increase of MR rate of change. For this reason, it is substantially difficult to realize large MR rate of change which exceeds 20% and a practical amount of resistance change of 5 ohms–30 ohms in the CIP-SV film which has the electronic reflective layers.

In contrast to this, a magnetoresistance effect element of a structure of passing sense current perpendicularly (current perpendicular to plane: CPP) to a film plane in the artificial lattice where magnetic layers and non-magnetic layers are laminated is proposed as a method of obtaining large MR which exceeds 30%. (hereafter called a "CPP type artificial-lattice").

With a CPP type artificial lattice type magnetoresistance effect element, electrodes are provided in the upper and lower sides of the artificial lattice where the ferromagnetic layers and the non-magnetic layers are laminated by turns, respectively, and sense current flows perpendicularly to the film plane. With this structure, the probability that sense current will cross a magnetic layer/non-magnetic layer interface becomes high. Therefore, it becomes possible to acquire the good interface effect, and big MR rate of change is obtained.

However, in such a CPP artificial lattice type film, it is necessary to measure a resistance perpendicular to the film plane of the artificial lattice SL which consists of a laminated structure of very thin metal films. This resistance will generally turn into a very small value. Therefore, with the CPP type artificial lattice, it has been an important technical subject to enlarge resistance as much as possible. Conventionally, it was indispensable to make the connected area of the artificial lattice SL and Electrodes EL as small as possible, and to increase the number of laminations of the artificial lattice SL, and to increase the total thickness, in order to enlarge the resistance.

For example, when pattering of the form of an element is carried out at 0.1 micrometer×0.1 micrometer, if Co layers (thickness:2 nm) and Cu layers (thickness:2 nm) are laminated 10 times by turns, the total thickness becomes 20 nm and the resistance of about 1 ohm may be obtained. However, the resistance is not large enough.

If it is considered from a viewpoint of resistance, it is indispensable to make it the artificial lattice type instead of a spin valve type, in order to obtain sufficient head output and to use as a good reading sensor for hard disks in a CPP type structure.

On the other hand, to use MR element for a MR head, it is necessary to control the magnetization of a magnetic layer and measure an external magnetic field efficiently. At the same time, it is required to form each magnetic layer into a single magnetic domain so that a Barkhausen noise etc. may not occur. However, as mentioned above, it is needed to laminate a magnetic layer and a non-magnetism layer repeatedly by turns in order to earn resistance, and it is technically very difficult to control magnetization by CPP type MR element individually to such many magnetic layers.

Moreover, when using MR element for a MR head, it is necessary to make the magnetization rotate very sensitively to a small signal magnetic field to that a large MR rate of change is obtained. For that, it is necessary to increase the signal magnetic-flux density in a sensing portion, so that a larger amount of magnetization rotations are obtained by the same magnetic-flux density. Therefore, it is necessary to make the total Mst (magnetization×film thickness) of the layers where magnetization rotates by an external magnetic field small. However, with a CPP type MR element, in order to earn resistance, it is necessary to laminate magnetic layers and non-magnetic layers repeatedly by turns. For this reason, Mst increases and it becomes difficult to raise the sensitivity to a signal magnetic flux.

Thus, in spite that MR rate of change in a case of a CPP artificial lattice type film exceeds 30%, the sensitivity needed as a MR sensor for magnetic heads is not obtained.

On the other hand, adopting a CPP system in the spin valve structure using FeMn/NiFe/Cu/NiFe, FeMn/CoFe/Cu/CoFe, etc. is also considered.

That is, a sense current is perpendicularly passed to a film plane to the laminated structure which has spin valve structure. However, in such CPP type SV structure, in order to enlarge resistance, it is necessary to thicken thickness of a magnetic layer to about 20 nm. Even in such a case, a resistance rate of change is only about 30% in 4.2K, and is predicted that only about 15% of resistance rate of change of the half may be obtained in room temperature.

That is, by the spin valve film of a CPP system, only about 15% of MR rate of change is obtained. And Mst of a free layer must be enlarged. Therefore, sensitivity required as a MR sensor for heads may not be obtained.

As explained above, various structures, such as a spin valve of a CIP type spin valve film, a CPP type artificial lattice, and a CPP type, are proposed. However, the present magnetic storage density is continuing the rise of an annual rate of 60% or more, and the further output increase will be needed from now on. However, the spin valve film which can be used with high storage density which exceeds 100 Gbits/inch2 at present and which has suitable resistance and the large amount of MR change, and serves as high sensitivity magnetically is difficult to realize.

SUMMARY OF THE INVENTION

According to an embodiment of the invention, there is provided a magnetoresistance effect element comprising: a magnetoresistance effect film including a magnetically pinned layer whose direction of magnetization is pinned substantially in one direction, a magnetically free layer whose direction of magnetization changes in response to an external magnetic field, and a nonmagnetic intermediate layer located between the pinned layer and the free layer, the nonmagnetic intermediate layer having a first layer including a first region whose resistance is relatively high and second regions whose resistance is relatively low and configured to have the sense current preferentially flow through the second regions when an sense current passes the first layer; and a pair of electrodes electrically coupled to the magnetoresistance effect film and configured to supply the sense current perpendicularly to a film plane of the magnetoresistance effect film.

According to other embodiment of the invention, there is provided a magnetoresistance effect element comprising: a magnetoresistance effect film including a magnetically pinned layer whose direction of magnetization is pinned substantially in one direction, a magnetically free layer whose direction of magnetization changes in response to an external magnetic field, and a nonmagnetic intermediate layer located between the pinned layer and the free layer, the nonmagnetic intermediate layer having a first layer made of an oxide, a concentration of oxygen in the first layer having a two-dimensional fluctuation, the first layer having a first region where the concentration of oxygen is equal to or higher than 40 atomic % and a second region where the concentration of oxygen is equal to or lower than 35 atomic %; and a pair of electrodes electrically coupled to the magnetoresistance effect film and configured to supply a sense current perpendicularly to a film plane of the magnetoresistance effect film.

According to other embodiment of the invention, there is provided a magnetic head comprising a magnetoresistance effect element having; a magnetoresistance effect film including a magnetically pinned layer whose direction of magnetization is pinned substantially in one direction, a magnetically free layer whose direction of magnetization changes in response to an external magnetic field, and a nonmagnetic intermediate layer located between the pinned layer and the free layer; and a pair of electrodes electrically coupled to the magnetoresistance effect film to supply a sense current perpendicularly to a film plane of the magnetoresistance effect film, the nonmagnetic intermediate layer having a first layer including a first region whose resistance is relatively high and second regions whose resistance is relatively low, and the sense current preferentially flowing through the second regions when the current passes the first layer.

According to other embodiment of the invention, there is provided a magnetic head comprising a magnetoresistance effect element having; a magnetoresistance effect film including a magnetically pinned layer whose direction of magnetization is pinned substantially in one direction, a magnetically free layer whose direction of magnetization changes in response to an external magnetic field, and a nonmagnetic intermediate layer located between the pinned layer and the free layer; and a pair of electrodes electrically coupled to the magnetoresistance effect film to supply a sense current perpendicularly to a film plane of the magnetoresistance effect film, the nonmagnetic intermediate layer having a first layer made of an oxide, a concentration of oxygen in the first layer having a two-dimensional fluctuation, and a first region where the concentration of oxygen is equal to or higher than 40 atomic % and a second region where the concentration of oxygen is equal to or lower than 35 atomic % being provided in the first layer.

According to other embodiment of the invention, there is provided a magnetic reproducing apparatus which reads information magnetically recorded in a magnetic recording medium, the magnetic reproducing apparatus comprising a magnetic head having a magnetoresistance effect element including: a magnetoresistance effect film including a magnetically pinned layer whose direction of magnetization is pinned substantially in one direction, a magnetically free layer whose direction of magnetization changes in response to an external magnetic field, and a nonmagnetic intermediate layer located between the pinned layer and the free layer; and a pair of electrodes electrically coupled to the magnetoresistance effect film to supply a sense current perpendicularly to a film plane of the magnetoresistance effect film, the nonmagnetic intermediate layer having a first layer including a first region whose resistance is relatively high and second regions whose resistance is relatively low, and the sense current preferentially flowing through the second regions when the current passes the first layer.

According to other embodiment of the invention, there is provided a magnetic reproducing apparatus which reads information magnetically recorded in a magnetic recording medium, the magnetic reproducing apparatus comprising a magnetic head having a magnetoresistance effect element including: a magnetoresistance effect film including a magnetically pinned layer whose direction of magnetization is pinned substantially in one direction, a magnetically free layer whose direction of magnetization changes in response to an external magnetic field, and a nonmagnetic intermediate layer located between the pinned layer and the free layer; and a pair of electrodes electrically coupled to the magnetoresistance effect film to supply a sense current perpendicularly to a film plane of the magnetoresistance effect film, the nonmagnetic intermediate layer having a first layer made of an oxide, a concentration of oxygen in the first layer having a two-dimensional fluctuation, and a first region where the concentration of oxygen is equal to or higher than 40 atomic % and a second region where the concentration of oxygen is equal to or lower than 35 atomic % being provided in the first layer.

According to other embodiment of the invention, there is provided a magnetic memory comprising a plurality of magnetoresistance effect elements arranged in a matrix fashion, the magnetoresistance effect element including: a magnetoresistance effect film including a magnetically pinned layer whose direction of magnetization is pinned substantially in one direction, a magnetically free layer whose direction of magnetization changes in response to an external magnetic field, and a nonmagnetic intermediate layer located between the pinned layer and the free layer; and a pair of electrodes electrically coupled to the magnetoresistance effect film to supply a sense current perpendicularly to a film plane of the magnetoresistance effect film, the nonmagnetic intermediate layer having a first layer including a first region whose resistance is relatively high and second regions whose resistance is relatively low, and the sense current preferentially flowing through the second regions when the current passes the first layer.

According to other embodiment of the invention, there is provided a magnetic memory comprising a plurality of magnetoresistance effect elements arranged in a matrix fashion, the magnetoresistance effect element including: a magnetoresistance effect film including a magnetically pinned layer whose direction of magnetization is pinned substantially in one direction, a magnetically free layer whose direction of magnetization changes in response to an external magnetic field, and a nonmagnetic intermediate layer located between the pinned layer and the free layer; and a pair of electrodes electrically coupled to the magnetoresistance effect film to supply a sense current perpendicularly to a film plane of the magnetoresistance effect film, the nonmagnetic intermediate layer having a first layer made of an oxide, a concentration of oxygen in the first layer having a two-dimensional fluctuation, and a first region where the concentration of oxygen is equal to or higher than 40 atomic % and a second region where the concentration of oxygen is equal to or lower than 35 atomic % being provided in the first layer.

As mentioned above, according to the embodiments of the invention, a current constriction effect can be obtained by providing an oxide intermediate layer which has a two-dimensional fluctuation of electrical conductivity, for example, and thereby a large change in resistance can be attained in a CPP-type structure.

As a result, a magnetic field detection with a high sensitivity can be stably obtain ed and a magnetic head having a high output and high S/N even at a high recording density and a magnetic reproducing apparatus, and a magnetic memory of the degree of high integration can be realized with low power consumption, and the merit on industry is great.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Figure 1:
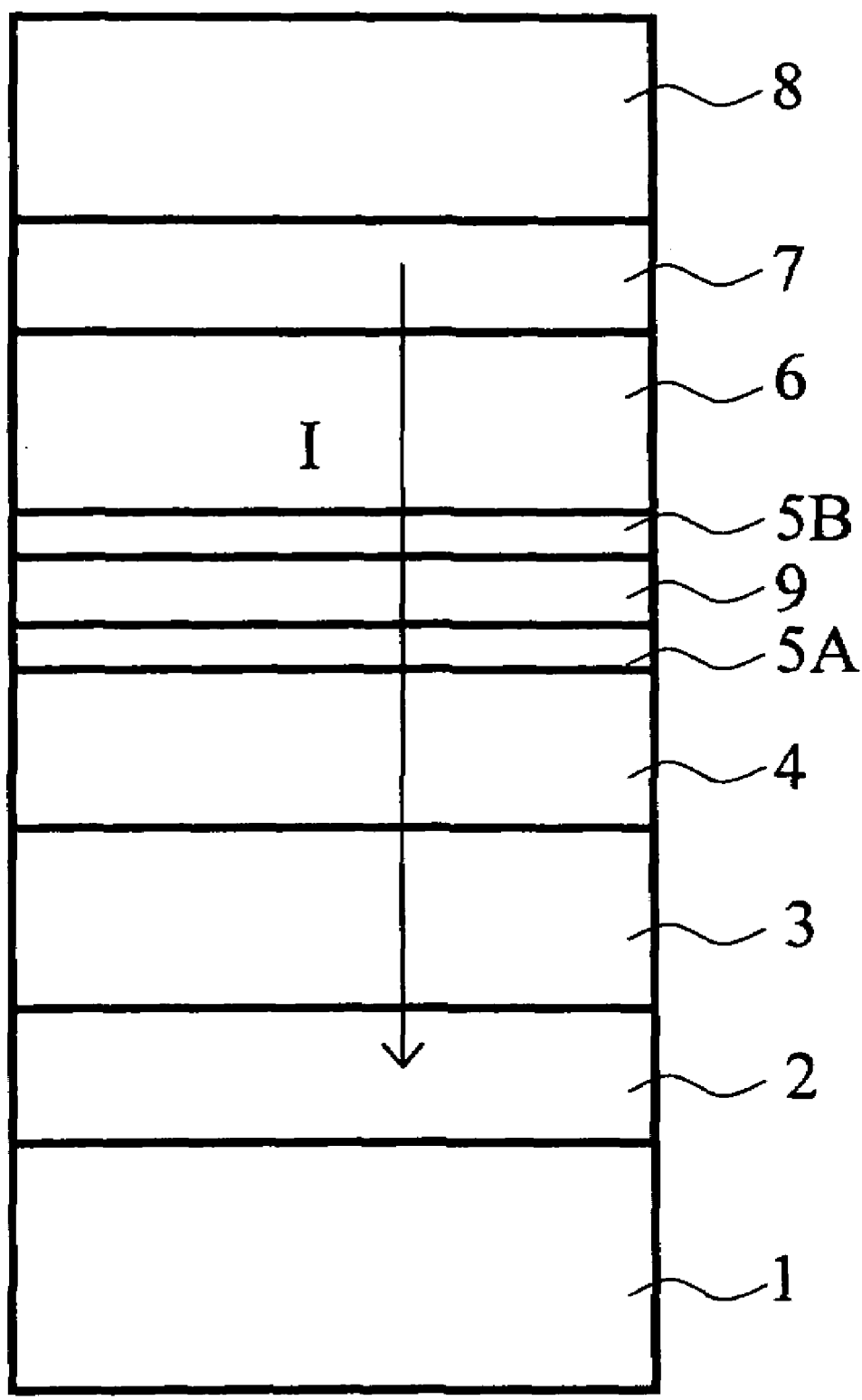
FIG. 1 is a conceptual diagram showing a cross-sectional structure of the magnetoresistance effect element according to the embodiment of the invention.

Hereafter, some embodiment of the invention will be explained, referring to the drawings.

FIG. 1 is a conceptual diagram showing a cross-sectional structure of the magnetoresistance effect element according to the embodiment of the invention. That is, on the substrate electrode 1, a base layer 2, an antiferromagnetic film 3, a magnetization pinned layer 4, an interface adjusting intermediate layer 5A, an oxide intermediate layer 9, an interface adjusting intermediate layer 5B, a magnetization free layer 6, a protection layer 7, and an upper electrode layer 8 are laminated in the order.

This element is a CPP type magnetoresistance effect element where sense current I (in the direction of the arrow in the figure or in a direction opposite to the arrow) is passed between the substrate electrode 1 and the upper electrode layer 9.

It is possible to determine whether the element is TMR or GMR, by investigating its conduction properties, such as ohmic characteristics, temperature dependence of a resistance, etc.

The interface adjusting intermediate layers 5A and 5B and the oxide intermediate layer 9 have the role which intercepts the magnetic coupling between t a magnetization pinned layer 4 and the magnetization free layer 6. The interface adjusting intermediate layers 5A and 5B also contribute to the magnetic properties of the magnetic layers. For example, by providing the interface adjusting intermediate layer 5B, the film quality of the free layer 6 can be improved, since the layer 5B acts as a buffer layer upon the film formation of the free layer 6.

Furthermore, the oxide intermediate layer 9 acts as a "current constriction layer." That is, the oxide intermediate layer 9 has a function of making the effective element size smaller and enlarging the amount of resistance change, by narrowing down the current path of sense current I.

Figure 2:
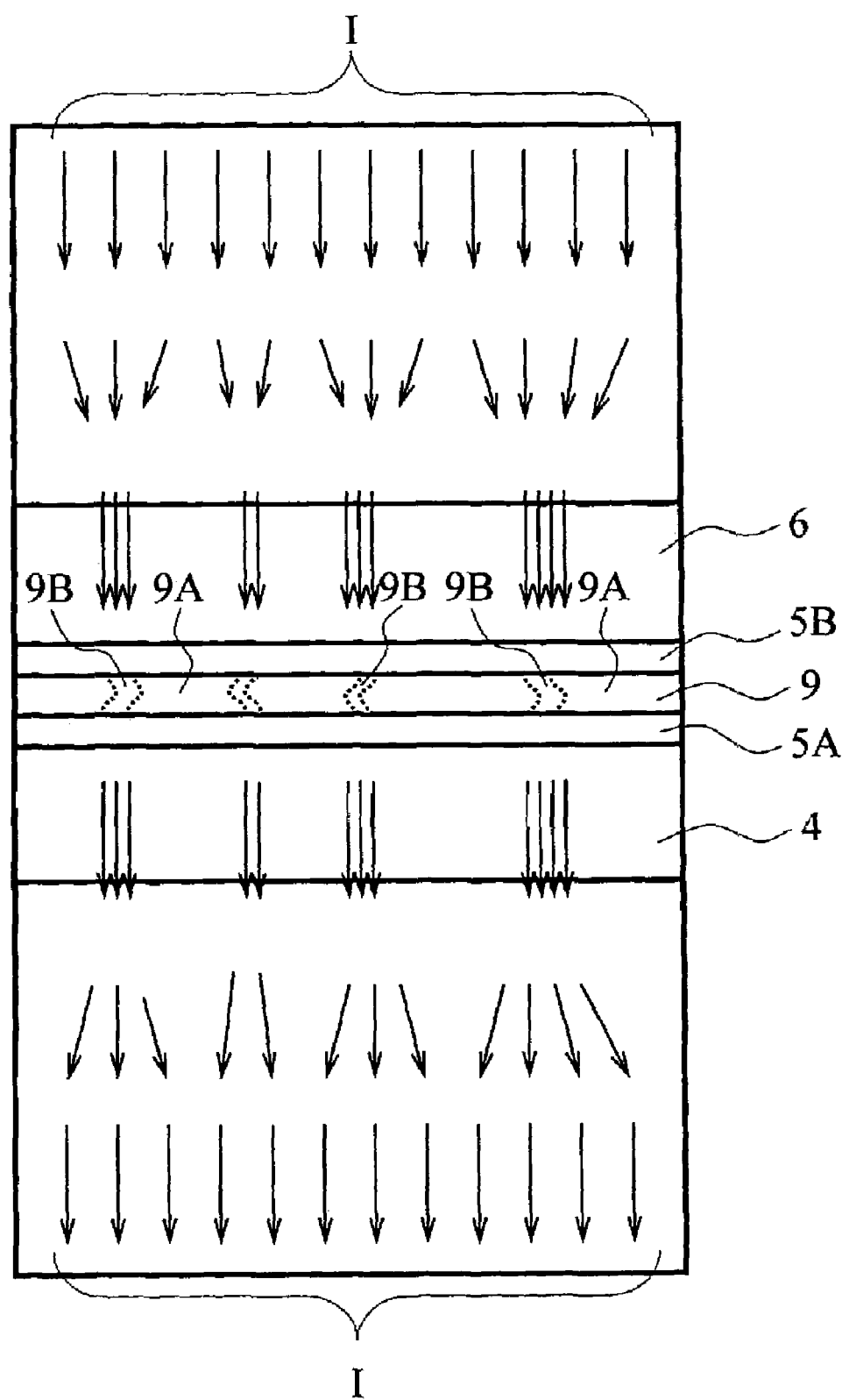
FIG. 2 is a diagram which expresses notionally that the oxide intermediate layer 9 performs the current constriction.

FIG. 2 is a diagram which expresses notionally that the oxide intermediate layer 9 performs the current constriction. As notionally illustrated in FIG. 2, the oxide intermediate layer 9 has a two-dimensional "fluctuation" of resistance in along its film plane. Therefore, the portions where the current concentrates exist and the current constriction effect is acquired.

That is, the resistance of the oxide intermediate layer 9 is fluctuating in a two-dimensional direction, and the high resistance regions 9A and low resistance regions 9B exist. The sense current I supplied from the electrode to the spin valve film is blocked by the high resistance regions 9A in the oxide intermediate layer 9, and flows through the low resistance regions 9B locally.

In the embodiment, since current flows through such low resistance regions 9B, the electric characteristics related with the oxide intermediate layer 9 current is kept ohmic. On the other hand, in the case of the so-called TMR (tunneling-magnetoresistance effect) element, an insulating layer is prepared between a pair of magnetic layers, and sense current passes this insulating layer by tunneling. Therefore, the current characteristic over the insulating layer in a TMR element shows the so-called "tunneling characteristic."

On the other hand, in the case of the magnetoresistance effect element of the embodiment, since the sense current passes through the low resistance regions in the oxide intermediate layer 9, ohmic characteristics is attained. Therefore, when the element of this embodiment is compared with TMR element, temperature characteristics of current etc. are different.

There is a method of investigating the relation between the sense current and a magnetoresistance effect as one of methods to investigate whether it is TMR-like or it is ohmic-like. In the case of TMR, stability is not acquired because a breakdown takes place easily, if resistance is low. When there is a tendency for a magnetoresistance rate of change to decrease by increase of the sense current, a possibility of being TMR is very high.

Alternatively, by investigating the temperature dependency of resistance, it can be distinguished. That is, in a case of the ohmic element, if temperature is lowered to about minus 200 degrees centigrade, a tendency for resistance to decrease compared with the state of room temperature will be seen. On the other hand, in the case of a TMR element, if temperature is lowered to about minus 200 degrees centigrade, a tendency for resistance to increase compared with the state of room temperature will be seen.

Now, in order to realize such a two-dimensional "fluctuation" in the magnetoresistance effect element of the embodiment, it is not necessary to form distinct low resistance regions 9B in the oxide intermediate layer 9. Rather, the oxide intermediate layer 9 may be formed so that it may be continuous. In other ward, the boundary of high resistance region 9A and low resistance region 9B does not need to be clear. In the oxide intermediate layer 9, it is easier to realize a homogeneous distribution of the current path in the case where the concentration of the oxygen continuously fluctuates in the two-dimensional direction, than in the case where the clear metal parts are formed in the layer 9.

The concentration fluctuation of such an oxide can be investigated by performing nano-EDX analysis. When oxygen concentration is too high, resistance becomes high and becomes less appropriate for an application to a magnetic head. For this reason, as for the oxygen concentration of low resistance region 9B, it is desirable to keep it below 35 atomic %. If resistance is too low on the contrary, the effect of output increase will not be acquired. For this reason, as for the oxygen concentration of high resistance region 9A, it is desirable to keep it more than 40 atomic %.

That is, if the portion of oxygen concentration below 35 atomic % and the portion of oxygen concentration more than 40 atomic % are provided, it is compatible in resistance adjustment and magnetoresistance effect increase. Moreover, it is easy to adjust to resistance with the one suitable as a magnetic head where the portion of the oxygen concentration more than 40 atomic % is larger than the portion of the concentration below 35 atomic %.

That is, it is a conceptual expression which was expressed in FIG. 2, and the high resistance region 9A and the low resistance region 9B do not need to be divided clearly. Rather, the region 9A and the region 9B can be formed so that the composition thereof is changing continuously.

In this specification, the term "homogeneous" means that no variation in the relevant characteristic is found in the element of 0.1 micrometer square. Since "fluctuation" of the conduction characteristic parallel in the film plane will substantially disappear and the resistance between the upper and lower electrodes of the element will become very high if the thickness of the oxide intermediate layer 9 becomes 3 nm or more, it becomes unsuitable to a magnetoresistance effect element of magnetic recording equipment.

For this reason, as for the thickness of the oxide intermediate layer 9, it is desirable to set it 3 nm or less. Furthermore, it is more desirable to set 2 nm or less. On the other hand, if the thickness of the oxide intermediate layer 9 is set to 0.4 nm or less, homogeneity will be lost and the tendency for the insulation in the portion which should block current to fall and for the current constriction effect to fall will be seen. Therefore, as for the oxide intermediate layers 9 thickness, it is desirable that it is 0.4 nm or more.

As a method of giving the oxide intermediate layer 9 "fluctuation" which produces the current constriction effect, the method of forming the oxide intermediate layer 9 using a metal layer which cannot oxidize easily can be mentioned. When an oxidization process is performed to a metal layer containing the element chosen from copper (Cu), gold (Au), silver (Ag), platinum (Pt), palladium (Pd), iridium (Ir), osmium (Os), etc. by 1% to 50%, the oxide intermediate layer 9 having such "fluctuation" can be formed easily.

As the oxide intermediate layer's 9 mother metal, it is desirable to choose at least one from the group consisting; boron (B), silicon (Si), germanium (germanium), tantalum (Ta), tungsten (W), niobium (Nb), aluminum (aluminum), molybdenum (Mo), phosphorous (P), vanadium (V), arsenic (As), antimony (Sb), zirconium (Zr), titanium (Ti), zinc (Zn), lead (Pb), thorium (Th), beryllium (Be), cadmium (Cd), a scandium (Sc), lantern (La), yttrium (Y), praseodymium (Pr), chromium (Cr), tin (Sn), gallium (Ga), Indium (In), rhodium (Rh), palladium (Pd), magnesium (Mg), lithium (Li), barium (Ba), calcium (calcium), strontium (Sr), manganese (Mn), iron (Fe), cobalt (Co), nickel (nickel), rubidium (Rb), and rare earth metals.

Among the above-mentioned element group, it is especially desirable to use at least one of boron (B), silicon (Si), germanium (germanium), tungsten (W), niobium (Nb), molybdenum (Mo), phosphorous (P), vanadium (V), antimony (Sb), zirconium (Zr), titanium (Ti), zinc (Zn), a lead (Pb), chromium (Cr), tin (Sn), gallium (Ga), iron (Fe), cobalt (Co), and rare earth metals.

Although aluminum (Al) and tantalum (Ta) tend to form amorphous oxides, the above-mentioned element tends to form crystalline oxides. In the case of the crystalline oxides, the deficit and excess of oxygen atoms affect the conduction characteristic rather intensively, therefore, it becomes easy to form the two-dimensional "fluctuation" of the conduction characteristic. By investigating the electron diffraction pattern of a nano-area, it is possible to determine whether it is crystalline material.

It can be also judged from a lattice image taken by a TEM (transmission electron microscopy). That is, it must be crystalline material if a periodic lattice image is seen.

Thus, as the material of the oxide intermediate layer 9, it is desirable to use oxides which include at least one of boron (B), silicon (Si), germanium (germanium), tungsten (W), niobium (Nb), molybdenum (Mo), phosphorous (P), vanadium (V), antimony (Sb), zirconium (Zr), titanium (Ti), zinc (Zn), a lead (Pb), chromium (Cr), tin (Sn), gallium (Ga), iron (Fe), cobalt (Co), and rare earth metals by 1%–50%.

On the other hand, the interface adjusting intermediate layers 5A and 5B are non-magnetic metal layers whose thicknesses are 1 nm or less. As the material of the interface adjusting intermediate layers 5A and 5B, copper (Cu), gold (Au), silver (Ag), platinum (Pt), palladium (Pd), iridium (Ir), osmium (Os), etc. can mainly be used.

As a material of the magnetization free layer 6, the metal magnetic material including at least one of nickel (nickel), iron (Fe), and cobalt (Co) as its main component may be used. In order to increase the sensitivity of a magnetic sensor and to decrease a Barkhausen noise, it is required to have the good soft magnetic characteristic. From this viewpoint, as for the magnetization free layer 6, it is desirable to laminate it in the direction of a crystal axis perpendicular to (111) which is the closest packed plane of a face-centered cubic lattice. However, a part of the layer 6 may be of a body-centered cubic lattice, of a hexagonal close-packed lattice, or of any other crystal structures.

If the thicknesses of the interface adjusting intermediate layers 5A and 5B are set to 1 nm or more, the current which is once constricted in the oxide intermediate layer 9 will spread in these interface adjusting intermediate layers 5A and 5B. Therefore, before the current reaches the magnetic layer which contributes to the magnetoresistance effect, the constriction effect will be lost. For this reason, as for the thicknesses of the interface adjusting intermediate layers 5A and 5B, it is desirable to set them 1 nm or less. Furthermore, it is more desirable that they are 0.25 nm or less.

Supposing the interface adjusting intermediate-layer 5B is not provided, the magnetization free layer 6 will be directly formed on the oxide intermediate layer 9. In this case, a bad influence may be exerted upon the film growth of the magnetization free layer 6, and the soft magnetic characteristic of the layer 6 may be degraded. For this reason, it is better to prepare interface adjusting intermediate-layer 5B of a certain amount of thickness, which consists of material, such as the copper (Cu), gold (Au), silver (Ag), platinum (Pt), palladium (Pd), iridium (Ir), and osmium (Os), between the oxide intermediate layer 9 and the magnetization free layer 6. The interface adjusting intermediate-layer 5B layer does not necessarily need to be a continuous film along its film plane direction, and may be partially missing.

Moreover, in the state where the element was completed, interface adjusting intermediate-layer 5B does not need to constitute the shape of a clear distinct layer. Interface adjusting intermediate-layer 5B may be diffused into the magnetization free layer 6 and/or the oxide intermediate layer 9 near the interfaces. If 10% or more of atoms which form interface adjusting intermediate-layer 5B exist between the oxide intermediate layer 9 and the magnetization free layer 6, there will almost be no degradation of the soft magnetic characteristic of the magnetization free layer 6, even it the interface adjusting intermediate-layer 5B is not formed as a clear distinct layer.

The existing ratio of these elements can be analyzed by the EDX (energy dispersive x-ray spectroscopy) etc.

On the other hand, interface adjusting intermediate-layer 5A is not necessarily required. However, if the interface adjusting intermediate-layer 5A is formed as a layer including an element such as copper (Cu), gold (Au), silver (Ag), platinum (Pt), palladium (Pd), iridium (Ir), and osmium (Os), and if the thickness of the intermediate-layer 5A is adjusted suitably, degree of the two-dimensional "fluctuation" in conduction can be adjusted in the case where the oxide intermediate layer 9 includes elements such as, boron (B), silicon (Si), germanium (germanium), tungsten (W), niobium (Nb), molybdenum (Mo), phosphorous (P), vanadium (V), antimony (Sb), zirconium (Zr), titanium (Ti), zinc (Zn), a lead (Pb), chromium (Cr), tin (Sn), gallium (Ga), iron (Fe), cobalt (Co), and rare earth metals by 1%–50%.

Such an adjusting function of interface adjusting intermediate-layer 5A can also be simultaneously given to another interface adjusting intermediate-layer 5B.

That is, metal, such as copper (Cu), gold (Au), silver (Ag), platinum (Pt), palladium (Pd), iridium (Ir), and osmium (Os), is advantageous metal in order to give two-dimensional "fluctuation" of the degree of conduction to the oxide intermediate layer 9. It becomes easy to form the two-dimensional "fluctuation" of the degree of conduction, by forming interface adjusting intermediate-layers 5A or 5B with such metal and by supplying such metal element to the oxide intermediate layer 9 from the interface adjusting intermediate-layers 5A or 5B by diffusion etc.

On the other hand, a sputtering using the target which consists of an alloy of the substance used for the above-mentioned interface adjustment intermediate layer and the substance used for the oxide layer is advantageous to form the two-dimensional "fluctuation" of the degree of conduction. The sintered target may also be used which includes elements that do not form a solid solution.

Figure 3:
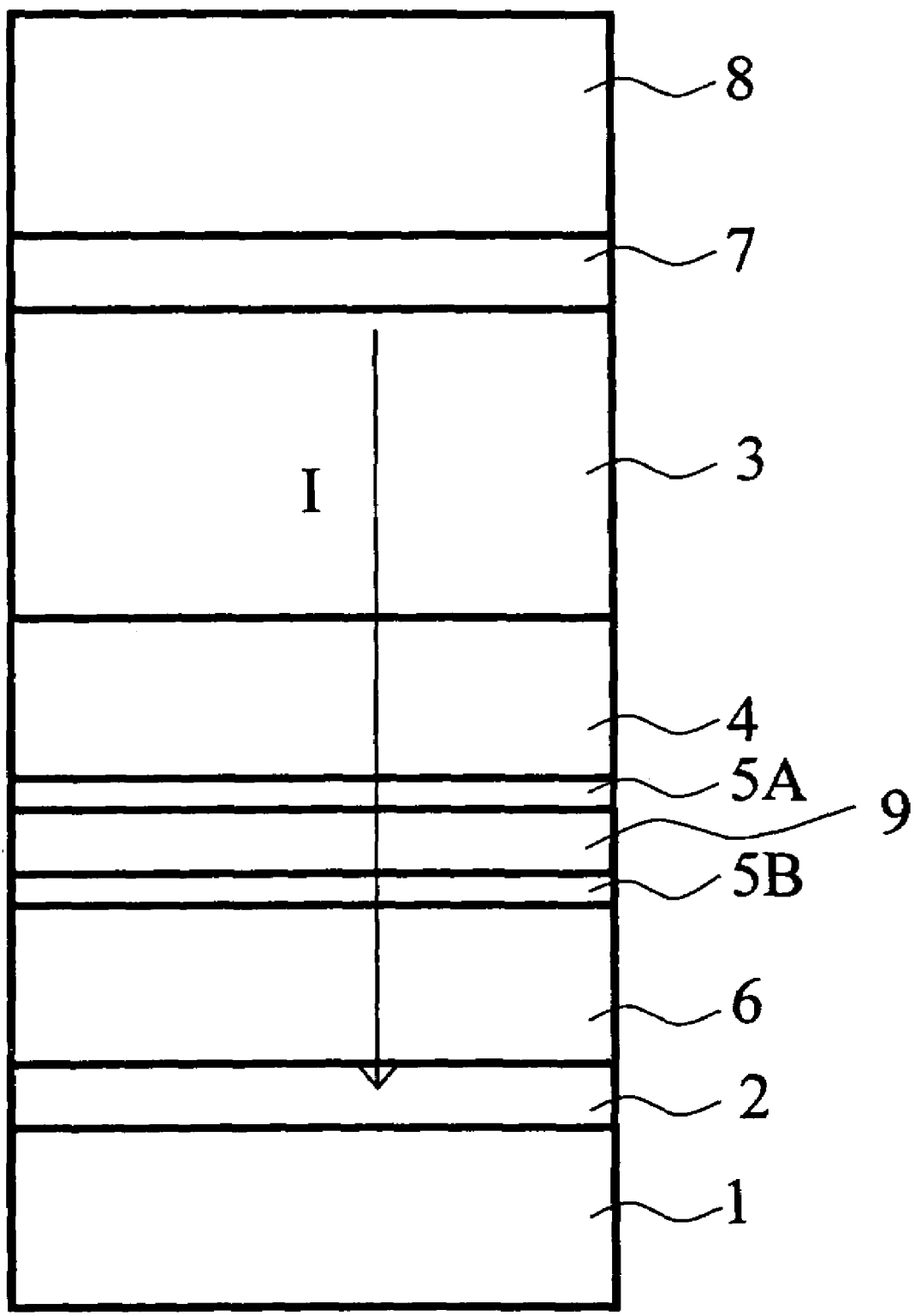
FIG. 3 shows a structure having the magnetization free layer 6 below the magnetization pinned layer 4.

Moreover, as illustrated in FIG. 3, in the structure having the magnetization free layer 6 below the magnetization pinned layer 4 (substrate side), the effect that is the same with having described above can be acquired. However, the influence which interface adjustment intermediate-layer 5B has on the soft magnetic characteristic of the magnetization free layer 6 is far small compared with the structure shown in FIG. 1.

Therefore, degradation of the soft magnetic characteristic of the magnetization free layer 6 is hardly occurred, even if the concentration of the atom which forms the interface adjusting intermediate-layer 5B is below 10% at the interface between the oxide intermediate layer 9 and the magnetization free layer 6.

Moreover, in a case of the so-called "dual spin valve structure" where the magnetization pinned layers are provided in the upper and lower sides of the magnetization free layer, the above-mentioned situation holds similarly.

In the invention, as the magnetization pinned layer 4, the so-called "synthetic anti-ferromagnetic structure" where two or more magnetic layers are coupled in an anti-ferromagnetic fashion by a non-magnetic layer such as a ruthenium (Ru) layer can also be used.

As explained above, according to the embodiment, the constriction of the sense current can be realized, effectual element size can be made to be able to reduce, and a large resistance change can be obtained, by providing the oxide intermediate layer 9 which has unique structure.

As the result, the CPP type magnetoresistance effect element of high sensitivity can be offered.

Hereafter, the example of such a magnetoresistance effect element and the example adapting the magnetoresistance effect element are explained.

FIRST EXAMPLE

First, the first example of the invention will be explained.

In this example, the magnetoresistance effect element of the structure expressed in FIG. 1 was manufactured with the comparative example.

That is, after forming the substrate electrode 1, the spin valve of the following film structure was formed on it:

5Ta/2Ru/15PtMn/4CoFe/1Ru/4CoFe/intermediate-layer/ 4CoFe/1Cu/10Ta

In the above, each number expresses the thickness (in nanometer) of the layer. This structure was formed by a DC magnetron sputtering. Then, annealing of 10 hours was performed at 270 degrees centigrade. And a patterning process was carried out to the planer shape into squares whose sizes ranged from 0.15 microns to 3 microns. Furthermore, after the surroundings of the patterned spin valve were filled up with insulators, such as alumina and a silicon oxide, the upper electrode 8 was formed, and thus the element having a structure of passing current perpendicularly to a film plane was completed.

Table 1 shows the structures of the intermediate layers in each manufactured element and the characteristic thereof. Resistance and the amount of resistance change (m $\Omega\mu m^2$) were normalized to the element size of 1 micron square, respectively.

Measurement of an electrical property was performed at about 0.1 mA to 20 mA using a constant current source. The multiplication of the resistance change and the sense current is obtained as an output.

As oxidization processing, oxyecoia partial pressure was made into the range of about $10_{-3}$ Pa to $10^{-2}$ Pa, and exposure for about 200 seconds was performed by using a vacuum chamber whose background pressure was $3\times10^{-6}$ Pa.

The sintered target of Cr—Cu was used to form the oxide layer.

Here, sample (1) is the comparative sample of the metal base where oxidation processing was not carried out.

Samples (2), (3), (4), and (5) are samples which have the interface adjusting intermediate layers of different thicknesses, respectively. It is seen that if the oxide layer is formed, resistance increases and the amount of resistance change also increases. When the interface adjusting intermediate layer is thickened, resistance and the amount of resistance change decrease quickly. And if an interface adjusting intermediate layers thickness exceeds 1 nm, the amount of resistance change becomes equivalent to or even lower than the sample of a metal base, a merit will completely be lost. If an interface adjusting intermediate layer is not prepared, the soft magnetic characteristic of the magnetization free layer is lost and it becomes difficult to obtain a stable film quality and to obtain elements having a constant characteristic.

Samples (6), (7), (8), and (9) have the oxide layers of different thicknesses, respectively. The amount of resistance change increases as resistance becomes larger. In a case where resistance exceeds 1000 mΩμm2, the element resistance becomes too large and problems, such as generation of heat, occur when the element is processed into the head corresponding to the track width of 0.1 to 0.2 micrometers. For this reason, as for resistance of an element, it is desirable that it is less than 100 mΩμm2.

Samples (10), (11), and (12) are for investigating the dependability of the characteristic by the difference in the concentration of an oxidized Cu—Cr layer. If the concentration of Cr is high, the amount of resistance change can be increased efficiently. If the concentration of Cr becomes 50% or less, most effects of output increase will not be acquired.

Among samples (1)–(12), sample (2) has the film characteristic which is most suitable for head formation in respect of the resistance as well as the amount of resistance change.

Moreover, as a result of investigating about the thickness dependability of the samples which had $Cu_{10}Al_{90}$ layers to be oxidized, it turned out that the same effect is acquired. However, since there is a tendency for the optimal thickness of the layer to be oxidized to become thinner, thickness control becomes more difficult.

At the same time, the variation in the characteristic for every element may arise.

On the other hand, there are some methods which enables a more stable formation of a thin oxide film. For example, oxidation can be performed by activating the surface of a sample using rare gas ions. Or, before the oxidizing step, the surface of a sample can be improved by irradiating with ions. Or, before the oxidizing step, the surface of a sample can be improved by an annealing treatment. If these methods are used, a thin oxide film can be formed with sufficient reproducibility.

Table 2 shows the result oxidized by using these methods. Here, in the case of samples (14)–(18), the surface of aluminum90Cu10 was oxidized by a natural oxidation treatment. On the other hand, in the case of samples 19–21, oxidization of the samples was performed, after irradiating with ions. From Table 2 shows, it is clear that the comparatively higher magnetoresistance effect is obtained in the samples having performed the ion irradiation. Moreover, the variation of data is larger in the case of the samples formed by a natural oxidation.

When samples (19) and (20) are compared with samples (22) and (23), it turns out that the slightly high magnetoresistance effect is obtained for samples (19) and (20). That is, if thickness of an upper interface adjusting layer is thickened from 0.2 nm to 0.5 nm, a magnetoresistance effect will fall slightly. However, this fall is in a negligible range.

Moreover, when samples (1)–(13) are compared with samples (14)–(23), the range of the thickness where the optimal characteristic is acquired is different. That is, it turned out that the optimum thickness range differs for Cr90Cu10 and AlCu.

Moreover, in the sample (1)–(23), coercivity of a free layer was 15 or less Oe. In contrast, it turned out by another experiment that when an upper interface adjusting intermediate layer was not provided in these samples, coercivity of the free layer became in the range of 50–100Oe.

If coercivity of the free layer becomes such a high level, the sensitivity of the magnetoresistance effect element degraded. Thus, it turned out that by providing the upper interface adjusting layer, the coercivity of the free layer can be decreased.

It is considered that the upper interface adjusting intermediate layer acts as a buffer on the formation of the free layer. That is, by providing the upper interface adjusting layer, the film quality of the free layer can be improved. Thus, magnetic property of the free layer is improved.

Furthermore, as a result of investigating also about the materials of the interface adjusting intermediate layer the oxide intermediate layer, a certain amount of effect was acquired in all the material systems enumerated in the above, respectively. Moreover, the effect was seen also by using Ag, Pd, Os, Ir, and Pt as the material of the interface adjusting intermediate layer. Moreover, also in any of the substance enumerated in the above as the material of the oxide intermediate layer, it was confirmed that the effect was acquired.

When the sections of samples (2) and (3) were observed by TEM, the continuous oxides without a "break" were formed along the parallel direction to the film plane. In these sections, when EDX analysis was performed for every nanometer along the parallel direction to the film plane of the oxide intermediate layers, a distribution of 5 to 50% were seen for oxygen concentration. That is, a two-dimensional fluctuation of the concentration was seen. When the same observation was performed to sample (6), the oxide layer was discontinuous and oxygen concentration was in a range of 0 to 5%. This corresponds with resistance being too low and there being no effect over an output.

Moreover, when sense current was changed and measurement was performed to the range of 50 mV output voltage about sample (6), the resistance rate of change became the same value substantially in all sense current. It is a greatly different point from TMR element, since TMR element shows several % of phenomenon in a resistance rate of change in the same experiment.

In the invention, the upper and lower interface adjusting intermediate layers does not need to have the same thickness. That is, as for the thickness of the upper interface adjusting intermediate layer, about 0, 1 nm is desirable in order to improve the soft magnetic characteristic of the magnetization free layer. On the other hand, even if the lower interface adjusting intermediate layer is not formed, the rise of the magnetoresistance effect is acquired. However, in respect of resistance adjustment, it is advantageous to provide the lower interface adjusting intermediate layer which makes the resistance adjustment easier. Moreover, the effect of the same improvement in a magnetoresistance effect was acquired also with the structures where upside down reversal of these structures were carried out.

As explained above in full detail, referring to examples, it turned out that the optimal resistance and the optimal magnetoresistance effect for a magnetic head can be obtained by adjusting the thicknesses of the interface adjusting intermediate layer and oxide intermediate layer.

SECOND EXAMPLE

Next, the example of the CPP type magnetoresistance effect element which can be used as a magnetic head is given and explained as the second example of the invention.

Figure 4:
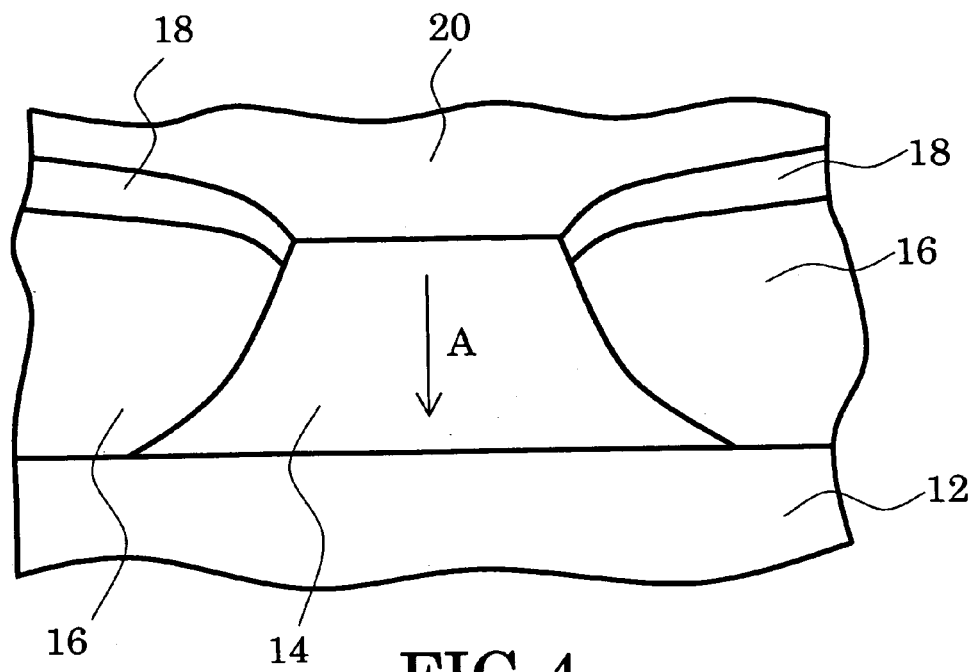
FIGS. 4 and 5 are conceptual diagrams which express typically the principal part structure of the magnetoresistance effect element concerning the embodiment of the invention.
Figure 5:
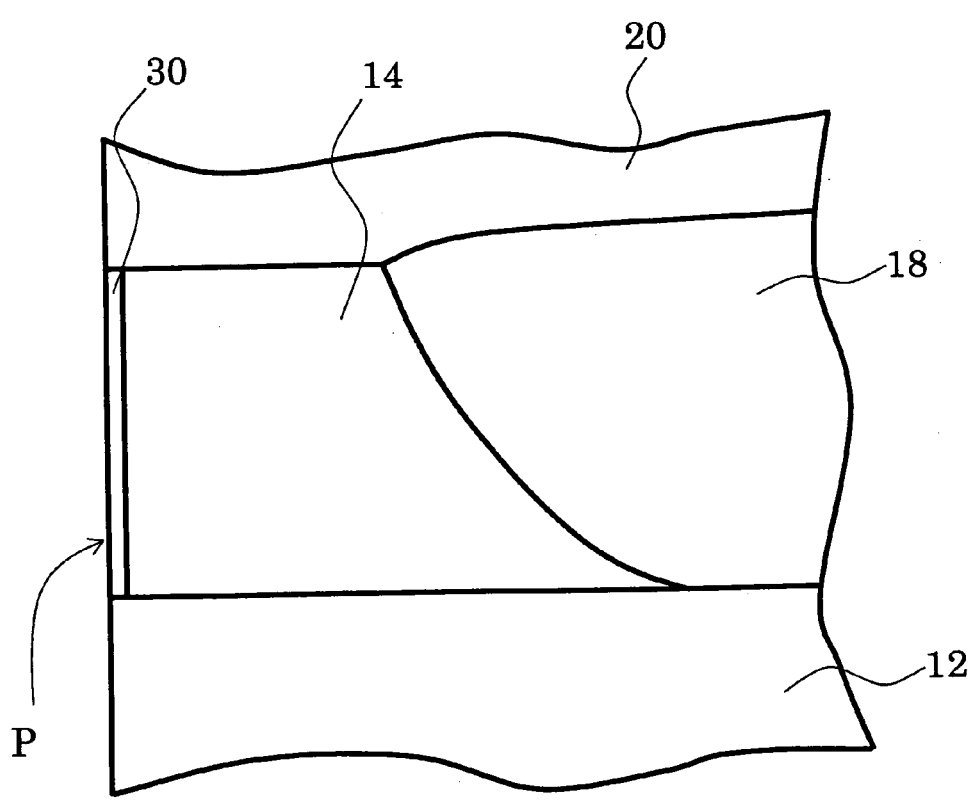

FIGS. 4 and 5 are conceptual diagrams which express typically the principal part structure of the magnetoresistance effect element concerning the embodiment of the invention. That is, these figures express the state where the magnetoresistance effect element is included in the magnetic head. FIG. 4 is a sectional view of the magnetoresistance effect element cut in parallel to the medium facing surface P which is opposite to a magnetic recording medium (not shown). FIG. 5 is a sectional view of the magnetic resistance effect element cut in the perpendicular direction to the medium opposite side P.

The magnetoresistance effect element illustrated in FIGS. 4 and 5 has a hard abutted structure. The lower electrode 12 and the upper electrode 20 are provided in the upper and lower sides of the magnetoresistance effect film 14, respectively. Moreover, as expressed in FIG. 5, the bias magnetic field applying film 16 and the insulating film 18 are laminated and provided in the both sides of the magnetoresistance effect film 14. Furthermore, as illustrated in FIG. 5, the protection layer 30 is provided in the medium facing surface of the magnetoresistance effect film 14.

The magnetoresistance effect film 14 has the structure according to the embodiment of the invention mentioned above referring to FIGS. 1 and 2. That is, the oxide intermediate layer who has the two-dimensional "fluctuation" of the degree of electric conduction is provided, and a large resistance change can be obtained by CPP type current supply.

The sense current to the magnetoresistance effect film 14 is passed in a perpendicular direction to the film plane, as indicated by the arrow A, with the electrodes 12 and 20 arranged at the upper and lower sides. Moreover, a bias magnetic field is applied to the magnetoresistance effect film 14 with a pair of bias magnetic field applying films 16 and 16 provided in right and left.

By this bias magnetic field, magnetic anisotropy of the free layer of the magnetoresistance effect film 14 can be controlled and formed into a single magnetic domain. As a result, magnetic domain structure can be stabilized, and the Barkhausen noise due to the movement of magnetic wall can be suppressed.

According to the invention, MR rate of change improves by providing the oxide intermediate layer which has two-dimensional "fluctuation" of the degree of electric conduction in the magnetoresistance effect film 14. As a result, it becomes possible to improve the sensitivity of a magnetoresistance effect element notably. And for example, when it is applied to a magnetic head, magnetic reproduction of high sensitivity is attained.

THIRD EXAMPLE

Next, a magnetic reproducing apparatus having inboard the magnetoresistance effect element of the embodiment will be explained as the third example of the invention.

That is, the magnetoresistance effect element or the magnetic head explained with reference to FIGS. 1 through 5 can be incorporated in a recording/reproducing magnetic head assembly and mounted in a magnetic reproducing apparatus.

Figure 6:
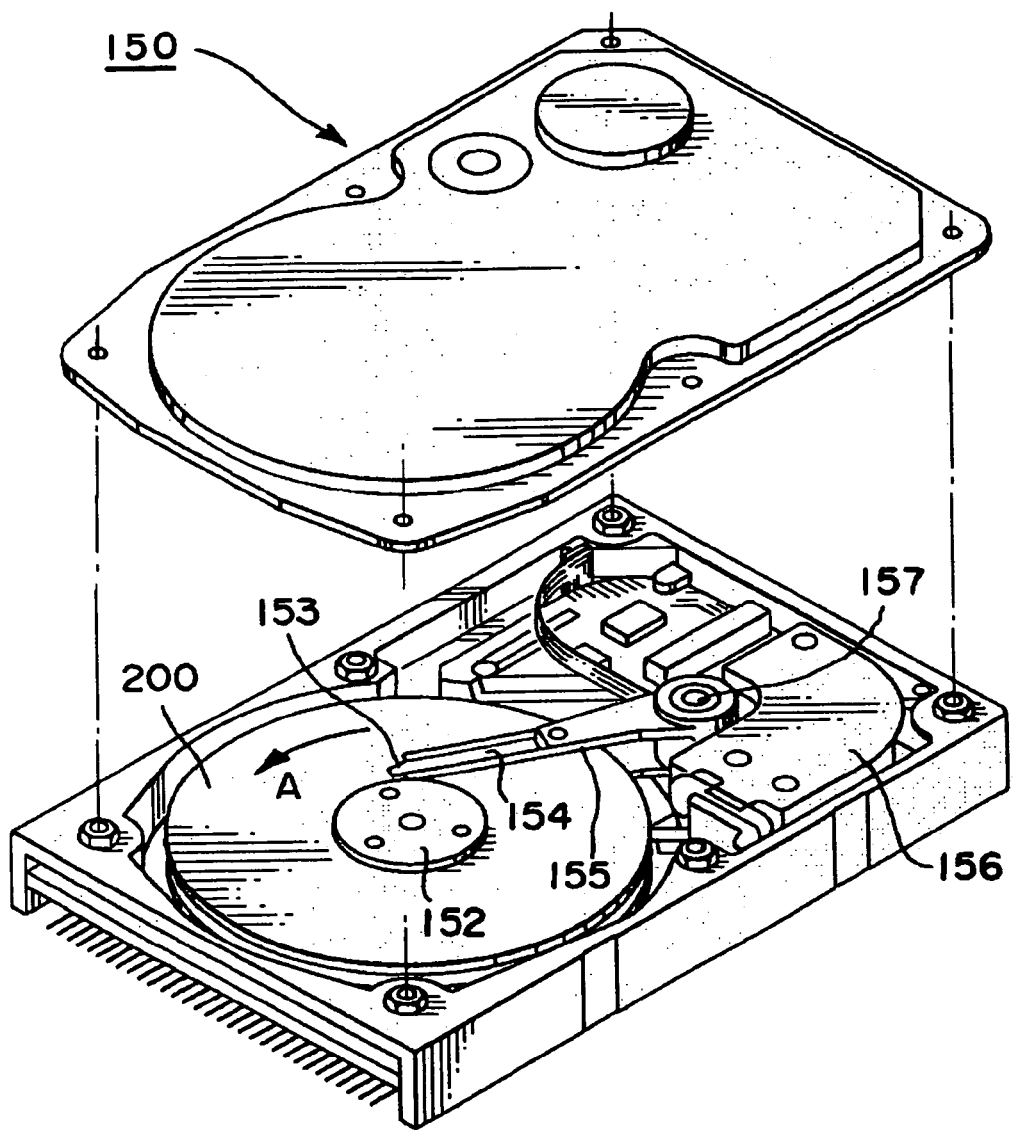
FIG. 6 is a sectional view of the magnetic resistance effect element cut in the perpendicular direction to the medium opposite side P.

FIG. 6 is a perspective view that shows outline configuration of this kind of magnetic reproducing apparatus. The magnetic reproducing apparatus 150 shown here is of a type using a rotary actuator. A magnetic reproducing medium disk 200 is mounted on a spindle 152 and rotated in the arrow A direction by a motor, not shown, which is responsive to a control signal from a controller of a driving mechanism, not shown. The magnetic reproducing apparatus 150 shown here may have a plurality of medium disks 200 inboard.

The medium disk 200 may be of a "lateral recording type" in which directions of the recording bits are substantially in parallel to the disk surface or may be of a "perpendicular recording type" in which directions of the recording bits are substantially perpendicular to the disk surface.

A head slider 153 for carrying out recording and reproduction of information to be stored in the medium disk 200 is attached to the tip of a film-shaped suspension 154. The head slider 153 supports a magnetoresistance effect element or magnetic head, for example, according to one of the foregoing embodiments of the invention, near the distal end thereof.

Once the medium disk 200 rotates, the medium-facing surface (ABS) of the head slider 153 is held floating by a predetermined distance above the surface of the medium disk 200. Also acceptable is a so-called "contact-traveling type" in which the slider contacts the medium disk 200.

The suspension 154 is connected to one end of an actuator arm 155 having a bobbin portion for holding a drive coil, not shown, and others. At the opposite end of the actuator arm 155, a voice coil motor 156, a kind of linear motor, is provided. The voice coil motor 156 comprises a drive coil, not shown, wound on the bobbin portion of the actuator arm 155, and a magnetic circuit made up of a permanent magnet and an opposed yoke that are opposed to sandwich the drive coil.

The actuator arm 155 is supported by ball bearings, not shown, which are located at upper and lower two positions of the spindle 157 and driven by the voice coil motor 156 for rotating, sliding movements.

Figure 7:
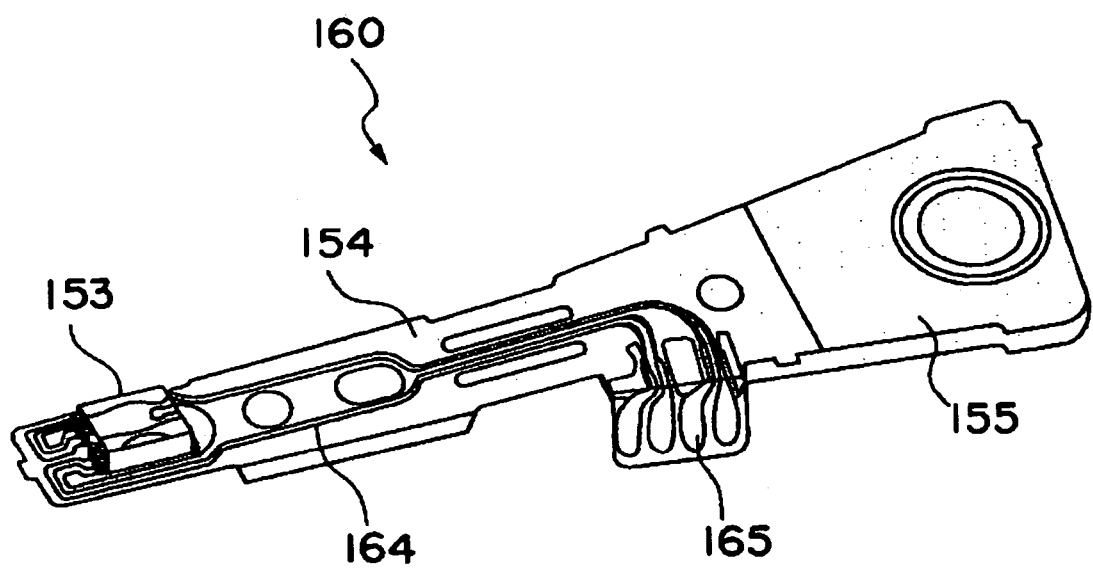
FIG. 7 is a perspective view of a magnetic head assembly at the distal end from an actuator arm 155 involved, which is viewed from the disk.

FIG. 7 is a perspective view of a magnetic head assembly at the distal end from an actuator arm 155 involved, which is viewed from the disk. The magnetic head assembly 160 includes the actuator arm 155 having the bobbin portion supporting the drive coil, for example, and the suspension 154 is connected to one end of the actuator arm 155.

At the distal end of the suspension 154, a head slider 153 carrying the magnetoresistance effect element as explained with reference to FIGS. 1 through 5 is provided. The suspension 154 has a lead 164 for writing and reading signals, and the lead line 164 is connected to electrodes of the magnetic head incorporated in the head slider 153. Numeral 165 in FIG. 7 denotes an electrode pad of the magnetic head assembly 160.

According to this example, one of the magnetoresistance effect elements already explained in conjunction with the aforementioned embodiments is used as the magnetoresistance effect element, information magnetically recorded on the medium disk 200 under a higher recording density than before can be read reliably.

FOURTH EXAMPLE

Next, a magnetic memory having the magnetoresistance effect element of the embodiment will be explained as the fourth example of the invention. That is, a magnetic memory, such as a magnetic random access memory (MRAM), where memory cells are arranged in the shape of a matrix can be realized by using the magnetoresistance effect element of the embodiment.

Figure 8:
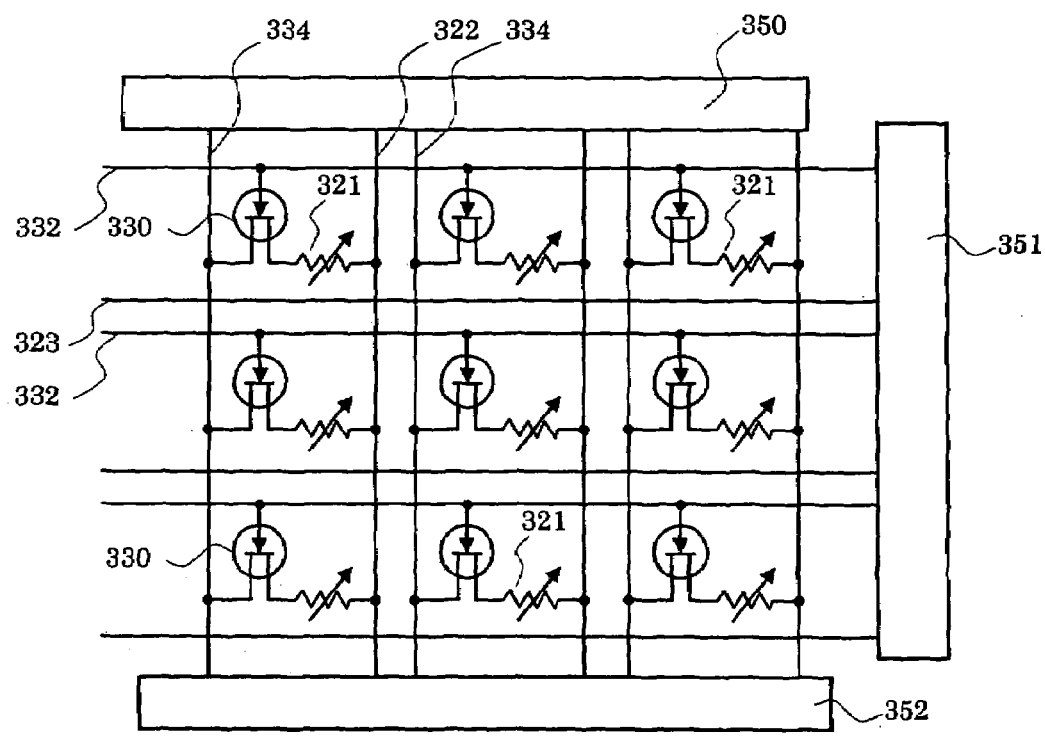
FIG. 8 is a conceptual diagram which exemplifies the matrix structure of the magnetic memory of the embodiment.

FIG. 8 is a conceptual diagram which exemplifies the matrix structure of the magnetic memory of the embodiment. That is, this figure shows the circuit structure of the embodiment in the case of having arranged the memory cells each of which includes a magnetoresistance effect element mentioned above with reference to FIGS. 1 through 5, in the shape of a matrix array.

In order to choose one bit in an array, it has the sequence decoder 350 and the line decoder 351. By selecting the bit line 334 and the word line 332, specific switching transistor 330 is turned on and a specific cell is chosen uniquely. And the bit information recorded on the magnetic-recording layer which constitutes the magnetoresistance effect element 321 can be read by detecting with a sense amplifier 352.

When writing in bit information, writing current is passed in the specific write-in word line 323 and the specific bit line 322, respectively, and the current magnetic field is applied to the recording layer of a specific cell.

Figure 9:
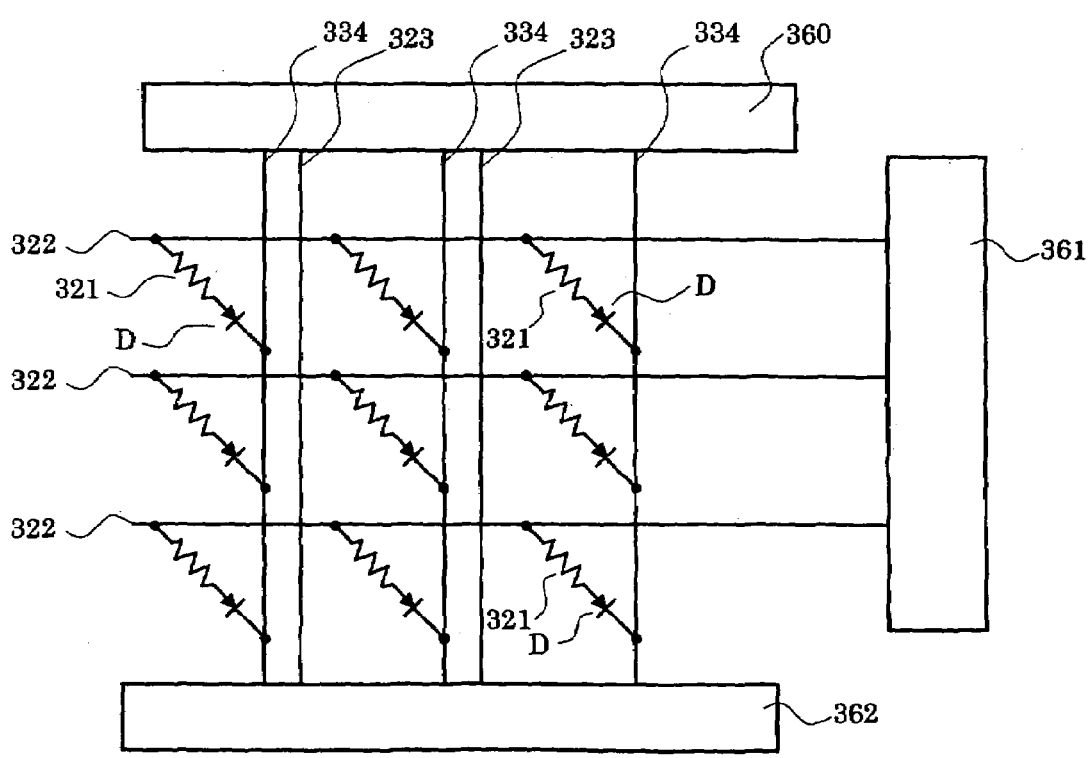
FIG. 9 is a conceptual diagram showing another example of the matrix structure of the magnetic memory of the embodiment.

FIG. 9 is a conceptual diagram showing another example of the matrix structure of the magnetic memory of the embodiment. That is, in the case of this example, the bit lines 322 and word lines 334 which were wired in the shape of a matrix are chosen by decoders 360 and 361, respectively, and the specific memory cell in an array is chosen uniquely.

Each memory cell has the structure where Diode D is connected with the magnetoresistance effect element 321 in series. Here, Diode D has the role to prevent that sense current detours in memory cells other than magnetoresistance effect element 321 selected.

In writing, write-in current is passed in a specific bit line 322 and a word line 323, thereby applying the current magnetic field to the recording layer of a specific cell.

Figure 10:
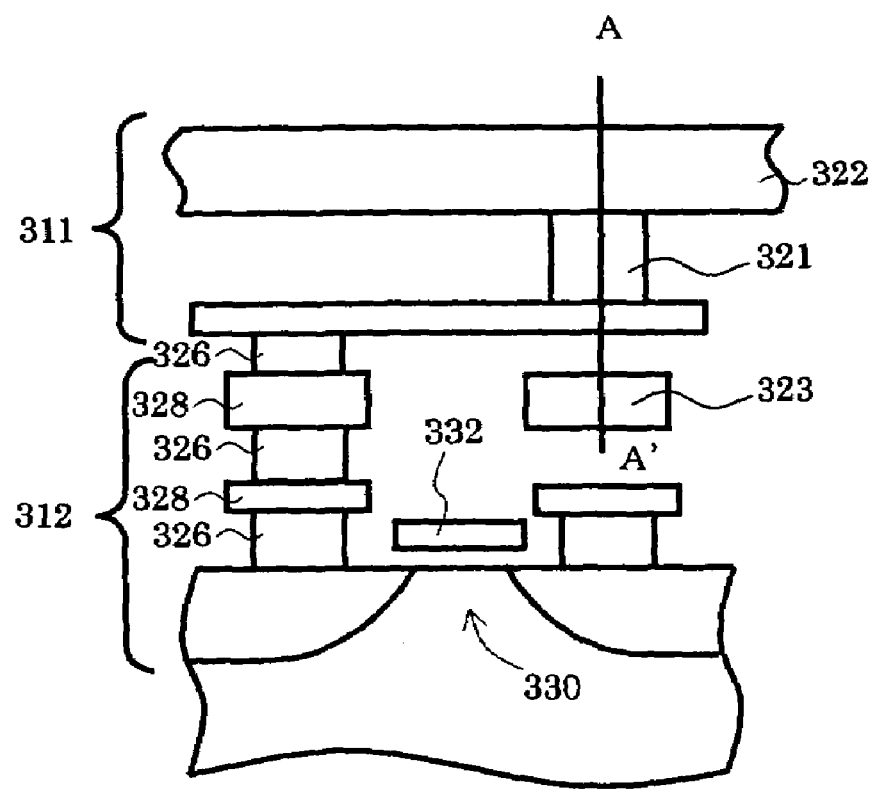
FIG. 10 is a conceptual diagram showing a principal part of the cross sectional structure of a magnetic memory according to an embodiment of the invention.

FIG. 10 is a conceptual diagram showing a principal part of the cross sectional structure of a magnetic memory according to an embodiment of the invention.

Figure 11:
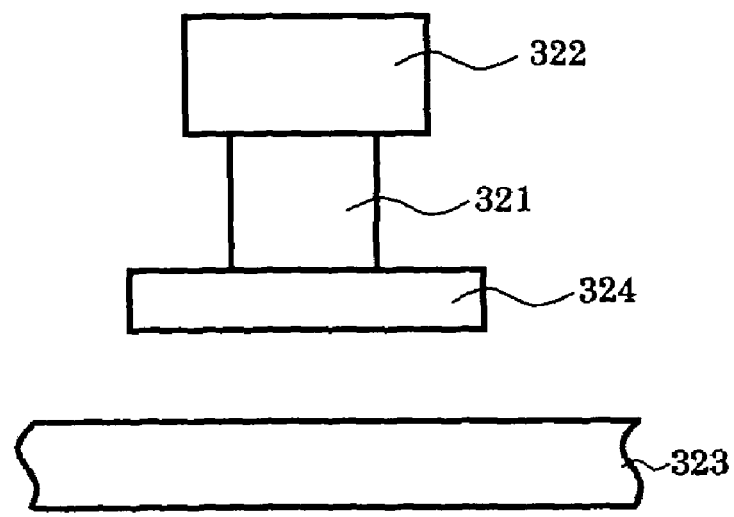
FIG. 11 shows the A–A' line sectional view of the memory cell shown in FIG. 10.
Figure 12:
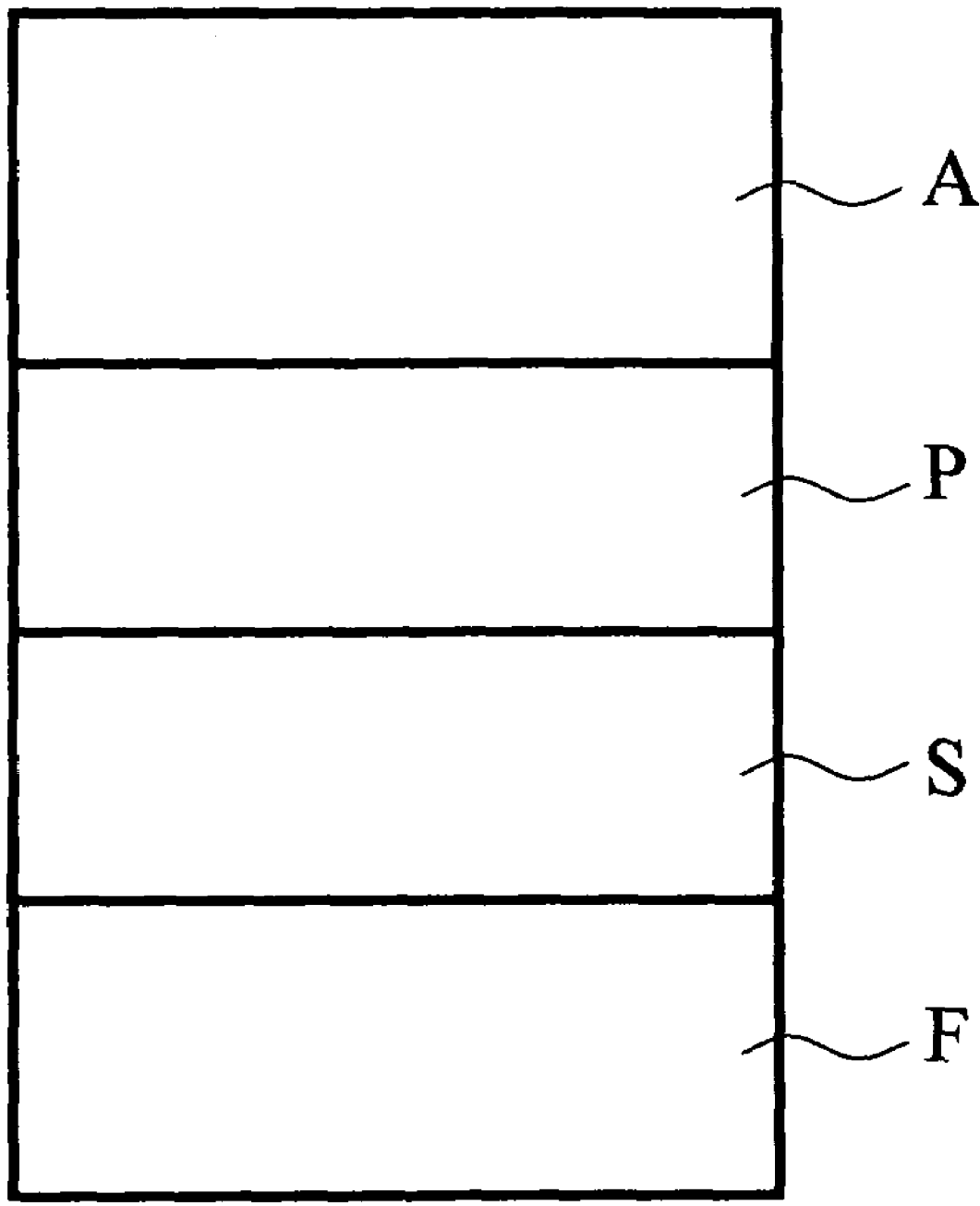
FIG. 12 is a conceptual diagram which illustrates the sectional structure of a spin valve film.

And FIG. 11 shows the A–A' line sectional view.

That is, the structure shown in these figures corresponds to the memory cell of the 1-bit portion of the magnetic memory which operates as a random access memory.

This memory cell consists of a storage cell portion 311 and a transistor portion 312 for address selection. The storage cell portion 311 has the magnetoresistance effect element 321 and a pair of wiring 322 and 324 connected to the element 321. The magnetoresistance effect element 321 has a structure mentioned with reference to FIGS. 1 through 5, and shows a large magnetoresistance effect.

What is necessary is to pass sense current for the magnetoresistance effect element 321 in the case of bit information read-out, and just to detect the resistance change. In addition, the magnetization free layer of the magnetoresistance effect element can be used as the magnetic recording layer.

A selecting transistor 330 connected through a via 326 and buried wiring 328 is formed in a transistor portion 312 for selection. This transistor 330 carries out switching operation according to the voltage applied to a gate 332, and controls switching of the current path between the magnetoresistance effect element 321 and wiring 334.

Moreover, under the magnetoresistance effect element, the write-in wiring 323 is formed in the direction which intersects the wiring 322. These write-in wirings 322 and 323 can be formed with the alloy containing aluminum (aluminum), copper (Cu), tungsten (W), tantalum (Ta), or one of these.

In a memory cell of such structure, when writing bit information in the magnetoresistance effect element 321, a write-in pulse current is passed to the wirings 322 and 323. Then, a synthetic magnetic field induced by these current is applied to a record layer, and magnetization of a record layer of the magnetoresistance effect element can be reversed suitably.

On the other hand, when reading bit information, sense current is passed through wiring 322, the magnetoresistance element 321 containing a magnetic-recording layer, and the lower electrode 324, and a change of the resistance of the magnetoresistance effect element 321 or resistance itself is measured.

By using the magnetoresistance effect element mentioned with reference to FIGS. 1 through 5, a large magnetoresistance effect is obtained. Therefore, a stable read-out can be performed even if the cell size is reduced to realize a large capacity storage.

Heretofore, embodiments of the invention have been explained in detail with reference to some specific examples. The invention, however, is not limited to these specific examples.

For example, material, shape and thickness of the ferromagnetic layer, anti-ferromagnetic layer, insulating film and ferromagnetic film of the magnetoresistance effect element according to the invention may be appropriately selected by those skilled in the art within the known techniques to carry out the invention as taught in the specification and obtain equivalent effects.

Further, in a case where the magnetoresistance effect element of the invention is applied to a magnetic head, by providing magnetic shields on upper and lower side of the element, the reproducing resolution can be regulated.

It will be also appreciated that the invention is applicable not only to optically-assisted magnetic heads or magnetic recording apparatuses of the lengthwise recording type but also to those of the perpendicular magnetic recording type and ensures substantially the same effects.

Further, the magnetic reproducing apparatus according to the present invention may be of a fixed type in which specific magnetic recording medium is permanently installed, while it may be of a removable type in which the magnetic recording medium can be replaced easily.

Further, also concerning the magnetic memory according to the invention, those skilled in the art will be able to carry out the invention by appropriately selecting a material or a structure within the known techniques.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

TABLE 1

| SAMPLE | LAYER SEQUENCE | RESISTANCE ($m\Omega \cdot \mu m^2$) | RESISTANCE CHANGE ($m\Omega \cdot \mu m^2$) | MR RATE(%) |
|---|---|---|---|---|
| SAMPLE 1 | 5Cu | 80 | 0.6 | 0.8 |
| SAMPLE 2 | 0.1Cu/0.6Cu$_{10}$Cr$_{90}$/OXIDATION TREATMENT/0.1Cu | 500 | 20 | 4.0 |
| SAMPLE 3 | 0.2Cu/0.6Cu$_{10}$Cr$_{90}$/OXIDATION TREATMENT/0.2Cu | 380 | 10 | 2.6 |
| SAMPLE 4 | 0.5Cu/0.6Cu$_{10}$Cr$_{90}$/OXIDATION TREATMENT/0.5Cu | 200 | 2 | 1.0 |
| SAMPLE 5 | 2Cu/0.6Cu$_{10}$Cr$_{90}$/OXIDATION TREATMENT/2Cu | 130 | 0.4 | 0.3 |
| SAMPLE 6 | 0.1Cu/0.4Cu$_{10}$Cr$_{90}$/OXIDATION TREATMENT/0.1Cu | 90 | 0.7 | 0.8 |
| SAMPLE 7 | 0.1Cu/0.5Cu$_{10}$Cr$_{90}$/OXIDATION TREATMENT/0.1Cu | 400 | 11 | 2.8 |
| SAMPLE 8 | 0.1Cu/0.7CU$_{10}$Cr$_{90}$/OXIDATION TREATMENT/0.1Cu | 1000 | 28 | 2.8 |
| SAMPLE 9 | 0.1Cu/0.8Cu$_{10}$Cr$_{90}$/OXIDATION TREATMENT/0.1Cu | 2500 | 31 | 1.2 |
| SAMPLE 10 | 0.1Cu/0.6Cr/OXIDATION TREATMENT/0.1Cu | 800 | 19 | 2.4 |
| SAMPLE 11 | 0.1Cu/0.6Cu$_{20}$Cr$_{50}$/OXIDATION TREATMENT/0.1Cu | 450 | 15 | 3.3 |
| SAMPLE 12 | 0.1Cu/0.6Cu$_{30}$Cr$_{70}$/OXIDATION TREATMENT/0.1Cu | 290 | 5 | 1.7 |
| SAMPLE 13 | 0.1Cu/0.6Cu$_{50}$Cr$_{40}$/OXIDATION TREATMENT/0.1Cu | 100 | 0.6 | 0.5 |

TABLE 2

| SAMPLE | LAYER SEQUENCE | RESISTANCE ($m\Omega \cdot \mu m^2$) | RESISTANCE CHANGE ($m\Omega \cdot \mu m^2$) | MR RATE(%) |
|---|---|---|---|---|
| SAMPLE 14 | 0.2Cu/0.6AlCu/NATURAL OXIDATION/0.2Cu | 250 | 1.75 | 0.7 |
| SAMPLE 15 | 0.2Cu/0.7AlCu/NATURAL OXIDATION/0.2Cu | 410 | 3.69 | 0.9 |
| SAMPLE 16 | 0.2Cu/0.8AlCu/NATURAL OXIDATION/0.2Cu | 1000 | 14 | 1.4 |
| SAMPLE 17 | 0.2Cu/0.9AlCu/NATURAL OXIDATION/0.2Cu | 3200 | 25.6 | 0.8 |
| SAMPLE 18 | 0.2Cu/0.6AlCu/RARE GAS ION + NATURAL OXIDATION/0.2Cu | 200 | 3.4 | 1.7 |
| SAMPLE 19 | 0.2Cu/0.7AlCu/RARE GAS ION + NATURAL OXIDATION/0.2Cu | 300 | 6 | 2 |
| SAMPLE 20 | 0.2Cu/0.8AlCu/RARE GAS ION + NATURAL OXIDATION/0.2Cu | 450 | 22.5 | 5 |
| SAMPLE 21 | 0.2Cu/0.9AlCu/RARE GAS ION + NATURAL OXIDATION/0.2Cu | 580 | 23.2 | 4 |
| SAMPLE 22 | 0.2Cu/0.7AlCu/RARE GAS ION + NATURAL OXIDATION/0.5Cu | 295 | 5.6 | 1.8 |
| SAMPLE 23 | 0.2Cu/0.8AlCu/RARE GAS ION + NATURAL OXIDATION/0.5Cu | 430 | 20.21 | 47 |

What is claimed is:

1. A magnetoresistance effect element comprising:
a magnetoresistance effect film including a magnetically pinned layer whose direction of magnetization is pinned substantially in one direction, a magnetically free layer whose direction of magnetization changes in response to an external magnetic field, and a nonmagnetic intermediate layer located between the pinned layer and the free layer, the nonmagnetic intermediate layer having a first layer made of an oxide, a concentration of oxygen in the first layer having a two-dimensional fluctuation, the first layer having a first region where the concentration of oxygen is equal to or higher than 40 atomic % and a second region where the concentration of oxygen is equal to or lower than 35 atomic %; and
a pair of electrodes electrically coupled to the magnetoresistance effect film and configured to supply a sense current perpendicularly to a film plane of the magnetoresistance effect film,
wherein a composition of the nonmagnetic intermediate layer changes continuously at a boundary between the first and second regions.

2. The magnetoresistance effect element according to claim 1, wherein an ohmic characteristic is obtained when the sense current passes the first layer.

3. The magnetoresistance effect element according to claim 1, wherein the oxide includes a element selected from the group consisting of boron (B), silicon (Si), germanium (Ge), tantalum (Ta), tungsten (W), niobium (Nb), aluminum (Al), molybdenum (Mo), phosphorous (P), vanadium (V), arsenic (As), antimony (Sb), zirconium (Zr), titanium (Ti), zinc (Zn), lead (Pb), thorium (Th), beryllium (Be), cadmium (Cd), scandium (Sc), lanthanum (La), yttrium (Y), praseodymium (Pr), chromium (Cr), tin (Sn), gallium (Ga), indium (In), rhodium (Rh), palladium (Pd), magnesium (Mg), lithium (Li), barium (Ba), calcium (Ca), strontium (Sr), manganese (Mn), iron (Fe), cobalt (Co), nickel (Ni), rubidium (Rb), and rare earth metals, as its main component.

4. The magnetoresistance effect element according to claim 1, wherein the first layer includes an element selected from the group consisting of copper (Cu), gold (Au), silver (Ag), platinum (Pt), palladium (Pd), iridium (Ir), and osmium (Os), in a range from 1 atomic % to 50 atomic %.

5. The magnetoresistance effect element according to claim 1, wherein the first layer is substantially crystalline.

6. The magnetoresistance effect element according to claim 1, wherein the nonmagnetic intermediate layer further has a second layer made of a non-magnetic metal.

7. The magnetoresistance effect element according to claim 6, wherein a thickness of the second layer is equal to or smaller than 1 nanometer.

8. The magnetoresistance effect element according to claim 6, wherein the non-magnetic metal is selected from the group consisting of copper (Cu), gold (Au), silver (Ag), platinum (Pt), palladium (Pd), iridium (Ir), and osmium (Os).

9. The magnetoresistance effect element according to claim 6, wherein the second layer is provided between the first layer and the magnetically pinned layer, or between the first layer and the magnetically free layer.

10. The magnetoresistance effect element according to claim 6, wherein the second layer is provided between the first layer and the magnetically pinned layer, or between the first layer and the magnetically free layer.

11. A magnetic head comprising the magnetoresistance effect element of claim 1.

12. A magnetic reproducing apparatus which reads information magnetically recorded in a magnetic recording medium, the magnetic reproducing apparatus comprising a magnetic head having the magnetoresistance effect element of claim 1.

13. A magnetic memory comprising a plurality of the magnetoresistance effect element of claim 1 arranged in a matrix fashion.

14. A magnetoresistance effect element comprising:

a magnetoresistance effect film including a magnetically pinned layer whose direction of magnetization is pinned substantially in one direction, a magnetically free layer whose direction of magnetization changes in response to an external magnetic field, and a nonmagnetic intermediate layer located between the pinned layer and the free layer, the nonmagnetic intermediate layer having a first layer made of an oxide, a concentration of oxygen in the first layer having a two-dimensional fluctuation, the first layer having a first region where the concentration of oxygen is equal to or higher than 40 atomic % and a second region where the concentration of oxygen is equal to or lower than 35 atomic %; and a pair of electrodes electrically coupled to the magnetoresistance effect film and configured to supply a sense current perpendicularly to a film plane of the magnetoresistance effect film, wherein the oxide includes an element selected from the group consisting of boron (B), silicon (Si), germanium (Ge), tungsten (W), niobium (Nb), molybdenum (Mo), phosphorous (P), vanadium (V), antimony (Sb), zirconium (Zr), titanium (Ti), zinc (Zn), lead (Pb), chromium (Cr), tin (Sn), gallium (Ga), iron (Fe), cobalt (Co), and rare earth metals, and further includes an element selected from the group consisting of copper (Cu), gold (Au), silver (Ag), platinum (Pt), palladium (Pd), iridium (Ir), and osmium (Os), in a range from 1 atomic % to 50 atomic %.

15. A magnetic head comprising the magnetoresistance effect element of claim 14.

16. A magnetic reproducing apparatus which reads information magnetically recorded in a magnetic recording medium, the magnetic reproducing apparatus comprising a magnetic head having the magnetoresistance effect element of claim 14.

17. A magnetic memory comprising a plurality of the magnetoresistance effect element of claim 14 arranged in a matrix fashion.

* * * * *